(12) United States Patent
Nakata et al.

(10) Patent No.: US 6,476,690 B1
(45) Date of Patent: Nov. 5, 2002

(54) LAMINATED LC COMPONENT WITH ROTATIONALLY SYMMETRIC CAPACITOR ELECTRODES

(75) Inventors: Yasuhiro Nakata, Fukui; Yoshihiro Fukuda, Takefu, both of (JP); Takahiro Azuma, Marietta, GA (US); Hidetoshi Yamamoto, Sendai (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/294,179

(22) Filed: Apr. 19, 1999

(30) Foreign Application Priority Data

Apr. 27, 1998 (JP) ............................................. 10-117366

(51) Int. Cl.[7] ................................................. H03H 7/01
(52) U.S. Cl. ...................... 333/185; 333/184; 361/321.2
(58) Field of Search ................................. 333/175, 184, 333/185; 361/321.2, 321.3

(56) References Cited

U.S. PATENT DOCUMENTS 5,357,227 A * 10/1994 Tonegawa et al. .......... 333/185
5,392,019 A * 2/1995 Ohkubo ................... 333/185 X
6,147,573 A * 11/2000 Kumagai et al. ........... 333/185

* cited by examiner

Primary Examiner—Justin P. Bettendorf
(74) Attorney, Agent, or Firm—Keating & Bennett, LLP (57) ABSTRACT

A laminated LC component has no directivity in terms of mounting and characteristics. A first set of coil conductors are electrically connected in series so as to define a first helical coil. A second set of coil conductors are also electrically connected in series so as to define a second helical coil. Capacitor electrodes are disposed such that they face each other with an insulating sheet disposed between the capacitor electrodes thereby forming a capacitor. The capacitor electrode at the ground side has a substantially cross shape and four ends of the substantially cross-shaped capacitor electrode are exposed at four respective sides of the insulating sheet. The insulating sheets are stacked on one another and fired so as to define a single unitary laminated block. Input/output electrodes are provided on the two respective ends of the laminated block and an external ground electrode is formed, at the center of the four side surfaces, in the shape of a band extending along a circumference of the laminated block. The four ends of the capacitor ground electrode are electrically connected, at the four side surfaces of the laminated block, to the external ground electrode.

23 Claims, 5 Drawing Sheets

LAMINATED LC COMPONENT WITH ROTATIONALLY SYMMETRIC CAPACITOR ELECTRODES

BACKGROUND OF THE INVENTION

1. Field of the Invention

The present invention relates to a laminated LC component, and more particularly, to a laminated LC component for use as a noise filter or the like in a high-frequency electronic circuit.

2. Description of the Related Art

Figure 5:
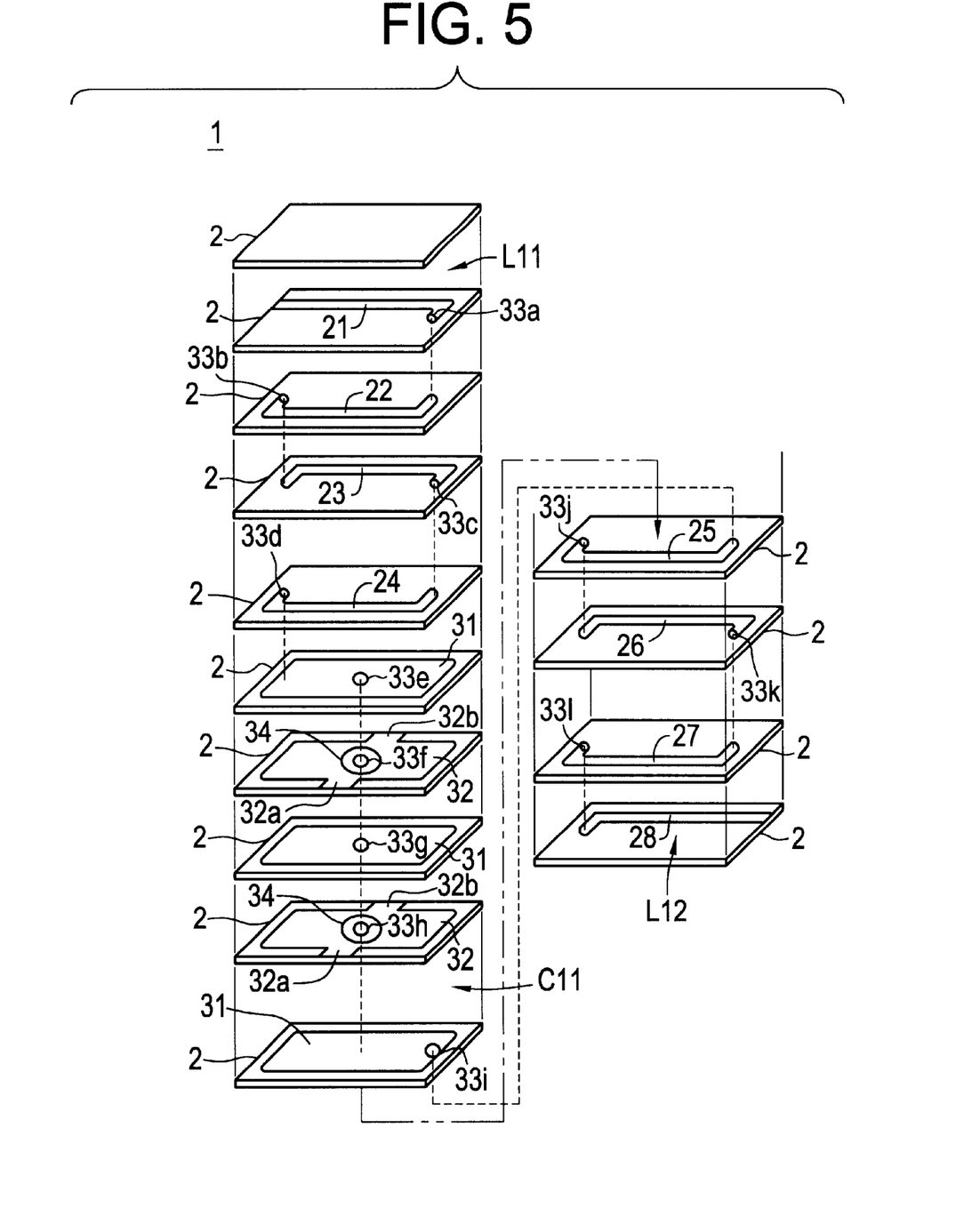
FIG. 5 is an exploded perspective view illustrating a conventional laminated LC component.
Figure 6:
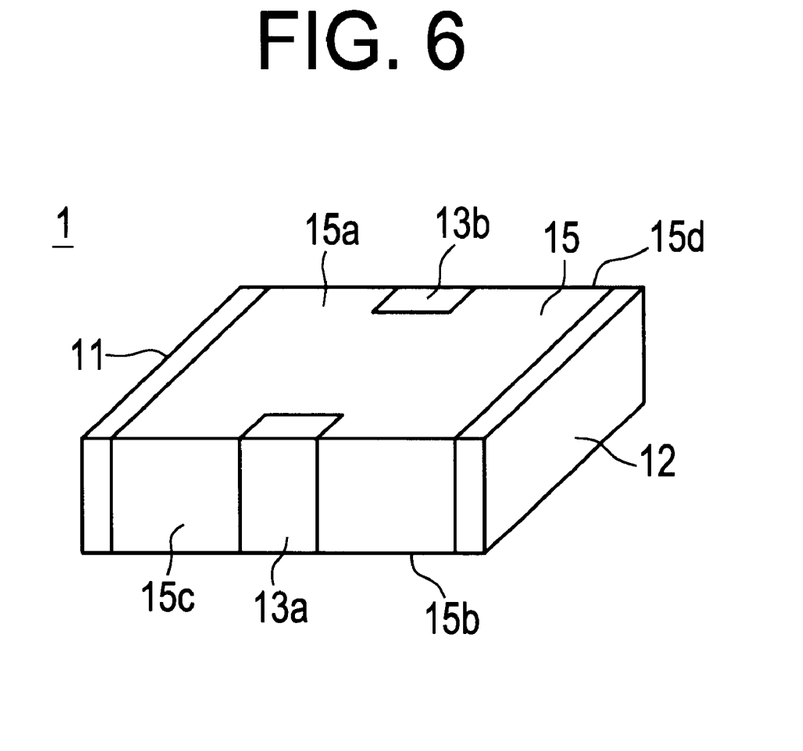
FIG. 6 is a perspective view illustrating the external appearance of the laminated LC component shown in FIG. 5.

FIGS. 5 and 6 illustrate an example of a conventional laminated LC component of the above-described type. The laminated LC component 1 includes insulating sheets 2 having respective coil conductors 21–28 provided on the surface of the respective insulating sheets 2, insulating sheets 2 having respective capacitor electrodes 31 and 32 disposed on the surface of the respective insulating sheets 2, and a cover sheet 2. These sheets 2 have a rectangular shape.

The coil conductors 21–24 are electrically connected in series through via-holes 33a–33c formed in the insulating sheets 2 so that the connected coil conductors define a helical coil L11. Similarly, the coil conductors 25–28 are electrically connected in series through via-holes 33j–33l formed in insulating sheets 2 so that the connected coil conductors define a helical coil L12. The capacitor electrodes 31 and 32 face each other with the insulating sheet 2 disposed therebetween such that a capacitor C11 is formed thereby. The plurality of capacitor electrodes 31 are electrically connected to one another through via-holes 33e–33h formed in insulating sheets 2.

An end of the coil L11 (more specifically, an end of the coil conductor 24) is electrically connected through a via-hole 33d to the capacitor electrode 31 which functions as one electrode of the capacitor C11. Similarly, an end of the coil L12 (more specifically, an end of the coil conductor 25) is electrically connected through a via-hole 33i to the capacitor electrode 31 which functions as an electrode of the capacitor C11. Both ends 32a and 32b of the capacitor electrode 32 are exposed at the front side and rear side, respectively, of the insulating sheet 2.

Figure 7:
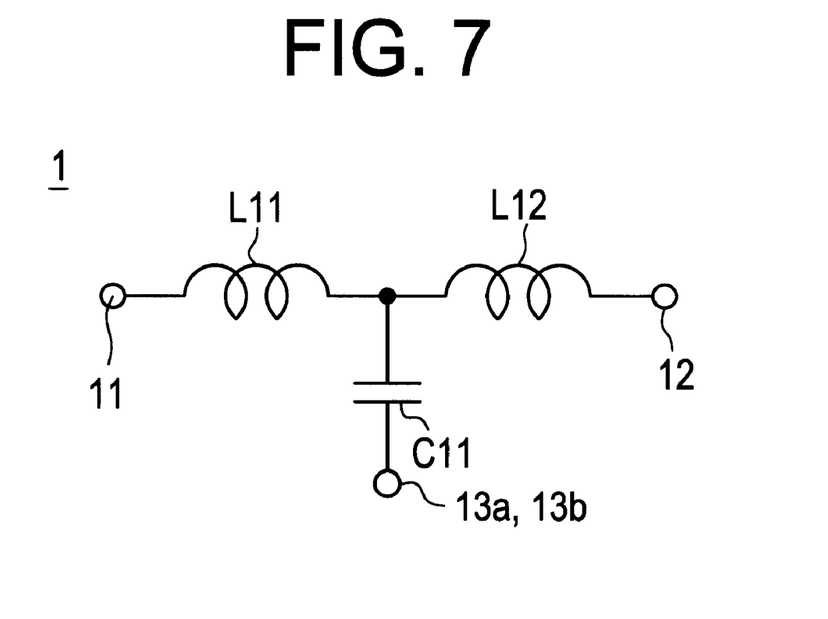
FIG. 7 is an equivalent electric circuit diagram of the laminated LC component shown in FIG. 6.

The insulating sheets 2 are stacked on one another and fired into the form of a single unitary laminated block 15 as shown in FIG. 6. External input/output electrodes 11 and 12 are formed on the left and right ends, respectively, of the laminated block 15, and external ground electrodes 13a and 13b are formed on the front and rear side surfaces 15c and 15d, respectively. An end of the coil L11 (more specifically, an end of the coil conductor 21) is electrically connected to the external input/output electrode 11 and an end of the coil L12 (more specifically, an end of the coil conductor 28) is electrically connected to the external input/output electrode 12. The ends 32a and 32b of the capacitor electrodes 32 are electrically connected to the external ground electrodes 13a and 13b, respectively. FIG. 7 is an equivalent electric circuit diagram of the laminated LC component 1 obtained in the above-described manner.

In the conventional laminated LC component 1, external ground electrodes 13a and 13b are provided only on the front and rear side surfaces 15c and 15d. As a result, the mounting surface of the laminated type LC component 1 is limited to either the upper side surface 15a or the lower side surface 15b of the laminated block 15. That is, the LC component 1 has directivity in terms of mounting orientation.

One possible technique to solve the above problem associated with the mounting directivity is to form an external ground electrode into the form of a band circumferentially extending over the four side surfaces of the laminated block 15. However, when the external ground electrode is simply formed along the entire circumference over the side surfaces 15a–15d, the ends 32a and 32b of the capacitor ground electrode 32 of the capacitor C11 formed in the laminated block 15 are exposed only at the side surfaces 15c and 15d of the laminated block 15 and thus, the length of the conductor path between the external ground electrode to the capacitor electrode 32 varies depending on which of the side surfaces 15a–15d is used as the mounting surface. Therefore, the high-frequency characteristics of the LC component 1 vary depending on the mounting surface that is used. That is, the LC component 1 has directivity in terms of the component characteristics.

Furthermore, because the laminated block 15 has a rectangular shape in lateral cross section, the external ground electrode formed along the entire circumference over the side surfaces 15a–15d has different shapes between the side surfaces 15a, 15b and the side surfaces 15c, 15d. Therefore, when the external ground electrode is produced, two different sets of jigs or tools are required. This results in a reduction in productivity efficiency.

SUMMARY OF THE INVENTION

To overcome the problems described above, preferred embodiments of the present invention provide a laminated LC component having no directivity in terms of mounting and component characteristics.

According to one preferred embodiment of the present invention, a laminated LC component includes a laminated block having a substantially square shape in lateral cross section and a plurality of insulating layers, a plurality of coil conductors, and a plurality of capacitor electrodes, a coil formed by electrically connecting the plurality of coil conductors, the coil having an axis that is substantially parallel to a stacking direction of the laminated block and also substantially parallel to the mounting surface of the laminated block; a capacitor defined by the plurality of capacitor electrodes, the capacitor being electrically connected to the coil, an external input/output electrode disposed on an end of the laminated block, and an external ground electrode having a band shape and extending along a circumference over four side surfaces of the laminated block, wherein the ends of the capacitor electrode, at the ground side, of the capacitor are exposed at the four respective side surfaces of the laminated block and the ends of the capacitor electrode are electrically connected, at the four side surfaces, to the external ground electrode, and wherein any of the four side surfaces is arranged to be usable as a mounting surface.

In the laminated type LC component constructed in the above-described manner, because the external ground electrode has a band shape extending along the circumference of the laminated block over the four side surfaces, there is no directivity in terms of mounting. Furthermore, because the ends of the capacitor ground electrode of the capacitor are electrically connected, at the four respective side surfaces, to the external ground electrode, the length of the conductor path from a ground pattern on a circuit board to the capacitor ground electrode via the external ground electrode becomes substantially equal whichever of the four side surfaces is used as the mounting surface. Therefore, the LC component has substantially equal high-frequency characteristics regardless of which of the four side surfaces of the laminated block is used as the mounting surface. That is, the LC component has no directivity in terms of the component characteristics.

DETAILED DESCRIPTION OF PREFERRED EMBODIMENTS

The laminated LC component according to the present invention is described in further detail below with reference to preferred embodiments in conjunction with the accompanying drawings.

Figure 1:
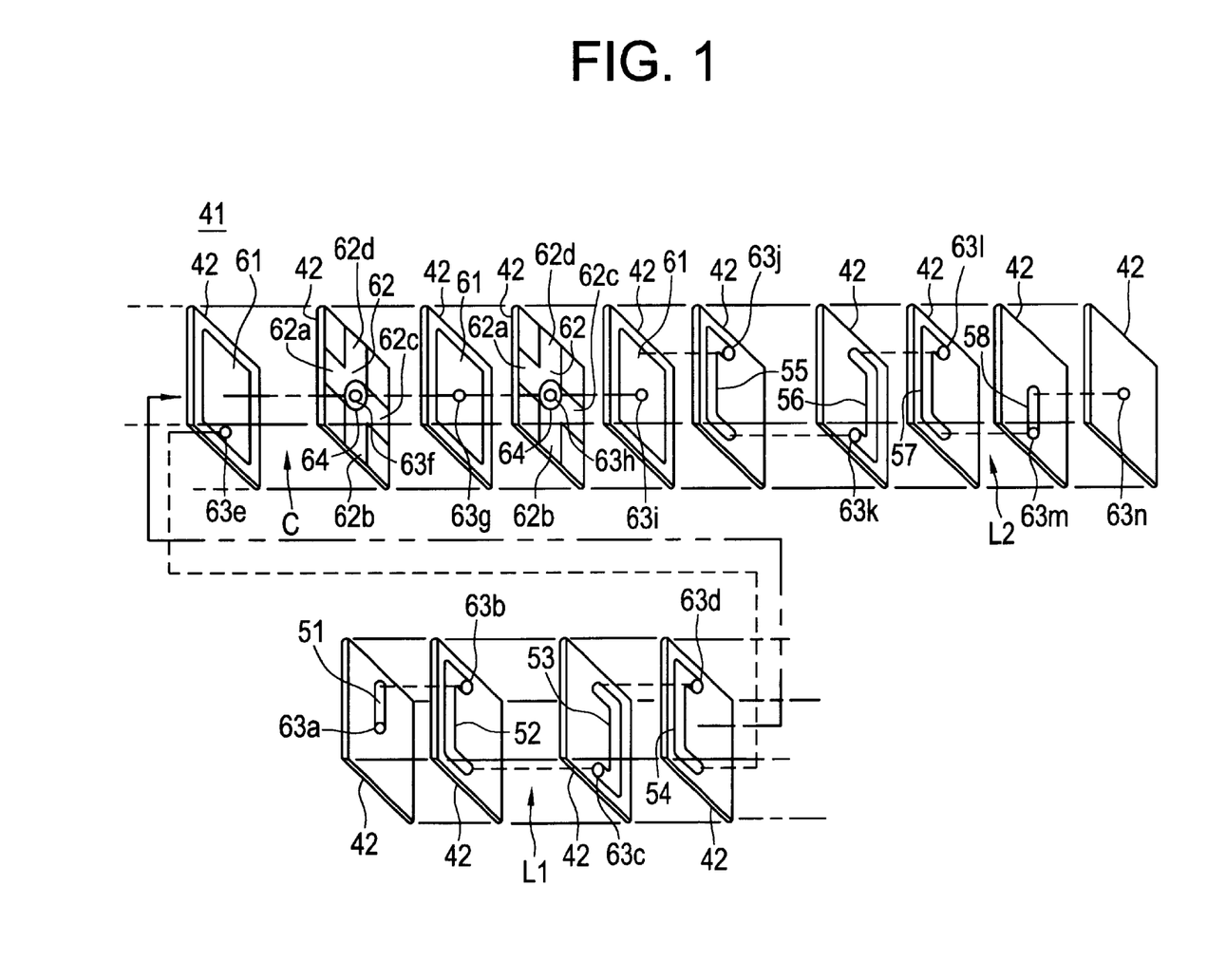
FIG. 1 is an exploded perspective view illustrating a preferred embodiment of a laminated LC component according to the present invention.

A laminated LC component 41 includes, as shown in FIG. 1, insulating sheets 42 having respective coil conductors 51–58 provided on the surface of the respective insulating sheets 42, the insulating sheets 42 having respective capacitor electrodes 61 and 62 disposed on the surface of the respective insulating sheets 42, and a cover sheet 42. The coil conductors 51–58 and the capacitor electrodes 61 and 62 may be formed on the surface of the insulating sheets 42 by printing, sputtering, evaporation, or other suitable method. As for the material used for forming the coil conductors 51–58, Ag, Ag—Pd, Cu, Ni, or other suitable material may be used. The respective sheets 42 have a substantially square shape (the shape is not necessarily required to be an exact square) and are made of a magnetic material such as a ferrite, a dielectric material such as ceramic, or an insulating material.

The coil conductors 51–54 are electrically connected in series through via-holes 63b–63d formed in the respective insulating sheets 42 so that the connected coil conductors define a helical coil L1. The coil conductors 55–58 are electrically connected in series through via-holes 63k–63m formed in insulating sheets 42 so that the connected coil conductors define a helical coil L2. The capacitor electrodes 61 and 62 face each other with the insulating sheet 42 disposed therebetween such that a capacitor C is formed therewith. The plurality of capacitor electrodes 61 are electrically connected to one another through via-holes 63f–63i formed in insulating sheets 42.

An end of the coil L1 (more specifically, an end of the coil conductor 54) is electrically connected through a via-hole 63e to the capacitor electrode 61 which functions as one electrode of the capacitor C. Similarly, an end of the coil L2 (more specifically, an end of the coil conductor 55) is electrically connected through a via-hole 63j to the capacitor electrode 61 which functions as an electrode of the capacitor C. There are clearances (areas where there is no electrode film) 64 between the respective capacitor electrodes 62 forming the other electrode of the capacitor C and the via-hole 63f or 63h for connecting the capacitor electrodes 61 to one another so that the capacitor electrodes 62 are prevented from being short-circuited to the via-hole 63f or 63h. The capacitor electrodes 62 preferably have a substantially cross shape and the four ends 62a, 62b, 62c, and 62d of each substantially cross-shaped capacitor electrodes 62 are exposed at the four respective sides of the corresponding insulating sheet 42. Thus, the shape of the capacitor electrodes 62 is rotationally symmetric about the via-hole 63f or 63h located at the center of the corresponding insulating sheets 42.

Figure 2:
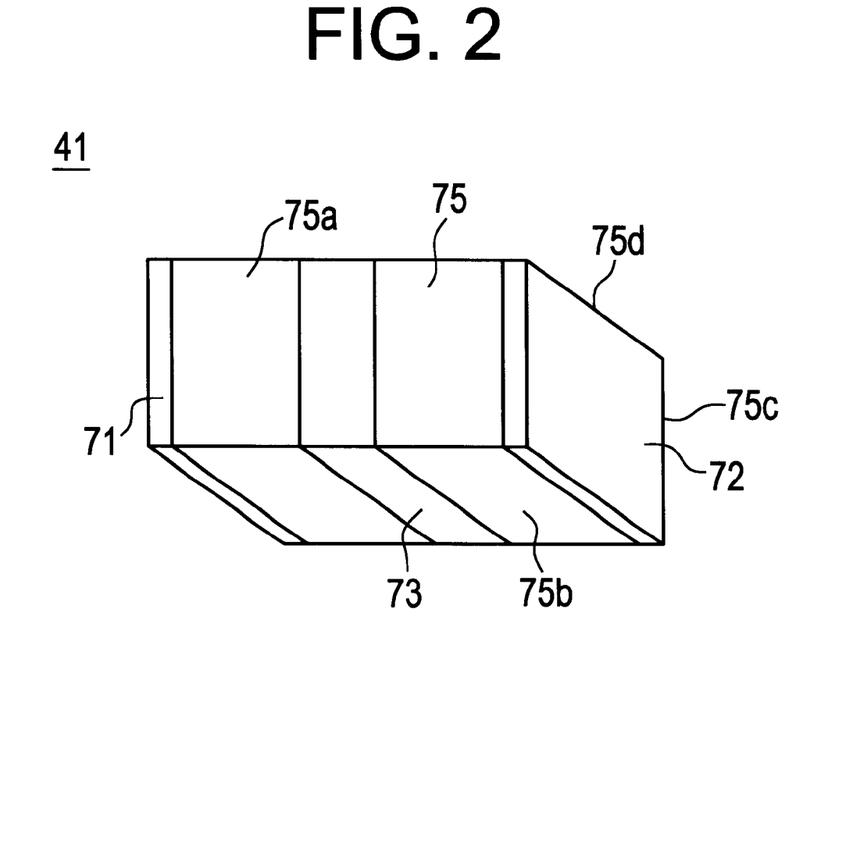
FIG. 2 is a perspective view illustrating the external appearance of the laminated LC component shown in FIG. 1.
Figure 3:
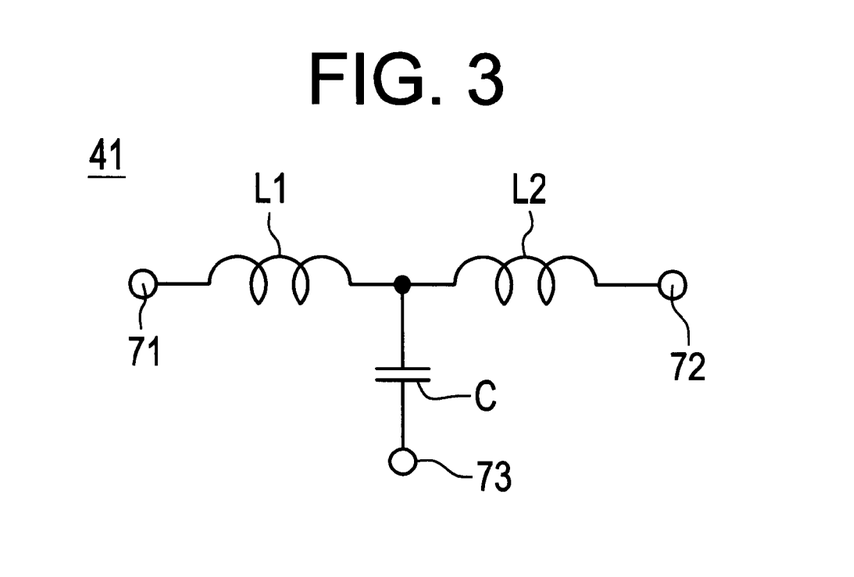
FIG. 3 is an equivalent electric circuit diagram of the laminated LC component shown in FIG. 2.

The insulating sheets 42 are stacked on one another and fired to define a single unitary laminated block 75 as shown in FIG. 2. Input/output electrodes 71 and 72 are disposed on the two respective ends of the laminated block 75 and an external ground electrode 73 is provided, at the approximate center of the four side surfaces 75a–75d, in the shape of a band extending along a circumference of the laminated block 75. An end of the coil L1 (more specifically, an end of the coil conductor 51) is electrically connected to the external input/output electrode 71 through a via-hole 63a and an end of the coil L2 (more specifically, an end of the coil conductor 58) is electrically connected to the external input/output electrode 72 through a via-hole 63m. The ends 62a–62d of the capacitor electrodes 62 are electrically connected, at the four side surfaces 75a–75d of the laminated block, to the external ground electrode 73. The external electrodes 71–73 may be formed by coating and baking of a conductive paste such as Ag, Ag—Pd, or Ni, or by means of dry plating. FIG. 3 is an equivalent electric circuit diagram of the laminated type LC component 41 obtained in the above-described manner.

In the laminated type LC component 41 constructed in the above-described manner, the axes of the coils L1 and L2 extend in a direction substantially parallel to the stacking direction of the sheets 42. Because the external ground electrode 73 is provided on all four side surfaces, along the entire circumference of the laminated block 75, it is possible to use any of the four side surfaces 75a–75d as the mounting surface. Therefore, the LC component 41 has no directivity in terms of mounting. Furthermore, because the ends 62a–62d of the capacitor ground electrodes 62 of the capacitor C are electrically connected at the four respective side surfaces 75a–75d to the external ground electrode 73, the length of the conductor path from a ground pattern on a circuit board to the capacitor ground electrode 62 via the external ground electrode 73 becomes substantially equal regardless of which of the four side surfaces 75a–75d is used as the mounting surface. Therefore, the LC component 41 has substantially equal high-frequency characteristics regardless of which of the four side surfaces is used as the mounting surface. That is, the LC component 41 has no directivity in terms of the component characteristics. Thus, it is possible to obtain a laminated LC component 41 having no directivity in terms of electrical characteristics and mounting.

Furthermore, because the laminated block 75 has a substantially square shape in lateral cross section, the external ground electrode 73 extending along the entire circumference over the side surfaces 75a–75d has an equal shape for any of the side surfaces 75a–75d. Therefore, only one type of jig or tool is required to produce the external ground electrode and thus, high productivity can be achieved.

Throughout the specification, "a substantially square shape in lateral cross section" includes "a substantially rectangular shape in lateral cross section, which is close to a mathematically exact square shape in lateral cross section without limit." A substantially rectangular shape in lateral cross section, which can be regarded as a substantially square shape in lateral cross section in view of surface mounting, is called "substantially a square shape in lateral cross section" in the specification of the present invention. The "lateral cross section" is defined by a plane perpendicular to the stacking direction of the insulating sheets 42, that is a plane which is parallel to the planes in which the insulating sheets are disposed.

To obtain a maximum possible inductance for the coil L1 or L2, the coil L1 or L2 has a substantially circular or substantially square shape (a substantially square shape is preferably used in this specific preferred embodiment) in cross section because the laminated block 75 is substantially square in lateral cross section. In contrast, in the case of the conventional laminated type LC component 1 shown in FIGS. 5 and 6, the laminated block 15 is substantially rectangular in lateral cross section. Therefore, to obtain a maximum possible inductance for the coil L1 or L2, the coil L1 or L2 has a substantially elliptic or substantially rectangular shape in cross section. When the circumference is equal, squares and circles have greater areas than rectangles and ellipses. Therefore, when laminated blocks are substantially equal in circumference, the laminated block 75 which is substantially square in lateral cross section has a greater lateral cross section for the coil L1 or L2, which results in a greater inductance.

Although the present invention has been described above with reference to preferred embodiments, the invention is not limited to preferred embodiments shown. It should be understood that various modifications may be made without departing from the spirit and scope of the invention.

Figure 4A:
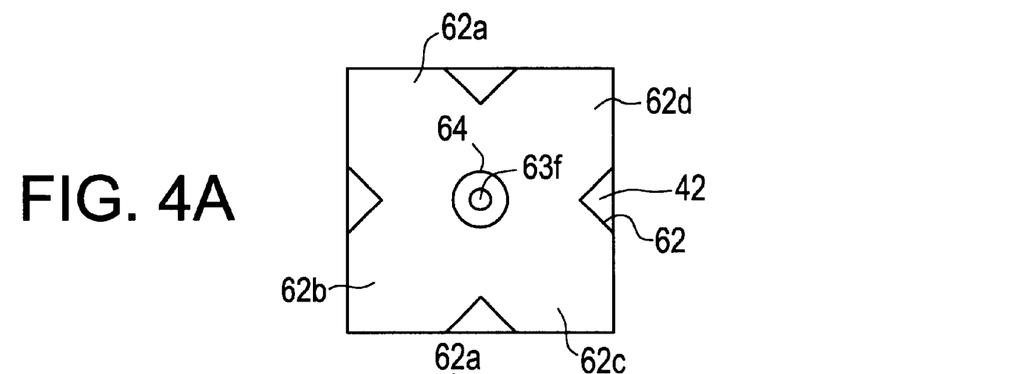
FIGS. 4A to 4D are plan views illustrating various modifications of an electrode of a capacitor of the laminated LC component shown in FIG. 1.
Figure 4B:
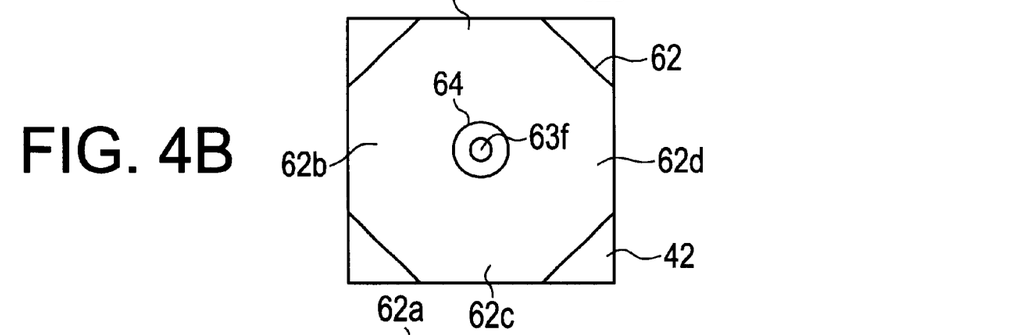
Figures 4C, 4D:
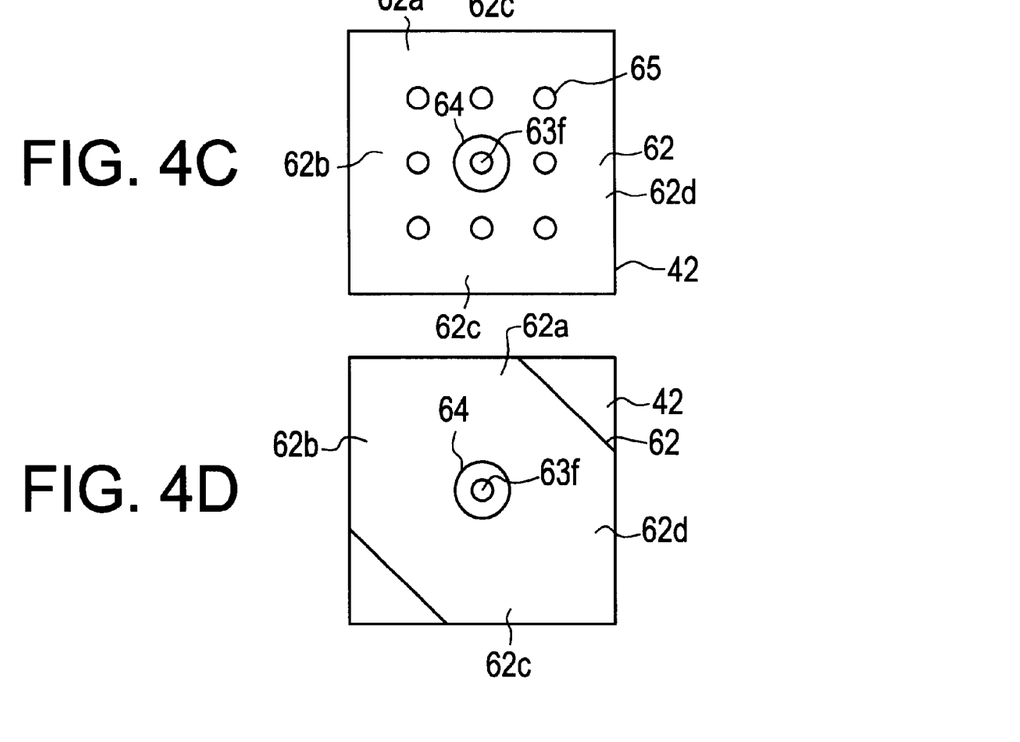

For example, instead of the substantially cross shape shown in FIG. 1, the capacitor ground electrodes 62 of the capacitor C may also have any of the shapes or patterns shown in FIGS. 4A–4D. FIGS. 4A and 4B illustrate an X-shaped pattern and a substantially octagonal pattern, respectively, for the capacitor electrode 62. In the example shown in FIG. 4C, the capacitor electrode 62 has a pattern that extends over substantially the entire area of an insulating sheet 42. In this example, the capacitor electrode 62 includes small circular-shaped non-conductive parts 65 so that better adherence between adjacent insulating sheets 42 can be achieved. FIG. 4D illustrates a band-shaped pattern of the capacitor electrode 62 wherein the band-shaped pattern extends from the left and upper corner to the right and lower corner of an insulating sheet 42.

Furthermore, although in the above-described preferred embodiments, the laminated LC component is produced by stacking insulating sheets having coil conductors or other electrodes provided on the surface thereof and then firing them into a single unitary laminated block, the method of producing the laminated LC component is not limited to such a process. For example, the insulating sheets may be fired before stacking. Furthermore, the laminated type LC component may also be produced by the following process. After forming an insulating layer by a printing or similar technique using an insulating material in the form of a paste, a conductive material in the form of a paste is coated on the surface of the insulating layer thereby forming a coil conductor or the like. An insulating material in the form of a paste is then coated on the coil conductor or the like so as to obtain an insulating layer in which the coil conductor or the like is embedded. A similar coating process is performed repeatedly so as to form further layers on one another thereby forming an LC component in the laminated structure.

As can be seen from the above description, the present invention has many various advantages. That is, because the external ground electrode has a band shape extending along a circumference of the laminated block over its four side surfaces, there is no directivity in terms of mounting. Furthermore, because the ends of the capacitor ground electrodes of the capacitor are electrically connected at the four respective side surfaces, to the external ground electrode, the length of the conductor path from a ground pattern on a circuit board to the capacitor ground electrode via the external ground electrode becomes substantially equal regardless of which of the four side surfaces is used as the mounting surface. Therefore, the LC component has substantially equal high-frequency characteristics regardless of which of the four side surfaces of the laminated block is used as the mounting surface. That is, the LC component has no directivity in terms of the component characteristics. Thus, it is possible to obtain a laminated LC component having no directivity in terms of electrical characteristics and mounting.

Furthermore, because the laminated block is substantially square in lateral cross section, high productivity is achieved in the process of forming the ground electrode along the entire circumference over the four side surfaces, and coils with a greater inductance can be embedded than the coils that can be embedded in a laminated block with the same circumference according to the conventional technique.

While the invention has particularly shown and described with reference to preferred embodiments thereof, it will be understood by those skilled in the art that the foregoing and other changes in form and details may be made therein without departing from the spirit and scope of the invention.

What is claimed is:

1. A laminated LC component comprising:

a laminated block including a plurality of insulating layers, a plurality of coil conductors, and a plurality of capacitor electrodes stacked on each other in a stacking direction, the laminated block including a mounting surface;

said plurality of coil conductors being electrically connected so as to define a coil, said coil having an axis that is substantially parallel to the stacking direction of said laminated block and also substantially parallel to the mounting surface of said laminated block;

said plurality of capacitor electrodes being arranged and electrically connected to define a capacitor, said capacitor being electrically connected to said coil;

an external input/output electrode disposed on an end of said laminated block; and an external ground electrode having a substantially band shape and extending along a circumference over four side surfaces of said laminated block;

wherein the ends of the capacitor electrodes at a ground side of the capacitor are exposed at the four respective side surfaces of said laminated block and said ends of the capacitor electrodes are electrically connected, at said four side surfaces, to the external ground electrode, and wherein any of said four side surfaces is arranged to be used as a mounting surface, and said capacitor electrodes having a rotationally symmetric configuration about the center of each of said capacitor electrodes.

2. The laminated LC component according to claim 1, wherein at least one of the capacitor electrodes has a substantially X-shaped configuration.

3. The laminated LC component according to claim 1, wherein via holes are formed in the plurality of insulating layers and clearance areas where no electrode material of the capacitor electrodes is located are defined between the via holes and the capacitor electrodes.

4. The laminated LC component according to claim 1, wherein at least one of the capacitor electrodes has a substantially octogonal configuration.

5. The laminated LC component according to claim 1, wherein at least one of the capacitor electrodes extends over an entire surface of a respective one of the insulating layers and include substantially circular non-conductive portions.

6. The laminated LC component according to claim 1, wherein one of the capacitor electrodes is a capacitor ground electrode, the LC component is mounted on a circuit board and a length of a conductor path from a ground pattern on the circuit board to the capacitor ground electrode via the external ground electrode is substantially equal if any of the four side surfaces is used as the mounting surface.

7. The laminated LC component according to claim 1, wherein the capacitor electrodes are each rotationally symmetric relative to the laminated block.

8. The laminated LC component according to claim 1, wherein the external ground electrode has a substantially uniform shape on each of the four side surfaces of the laminated block.

9. The laminated LC component according to claim 1, wherein the coil has a substantially square shape in cross-section.

10. The laminated LC component according to claim 1, wherein the coil has a substantially circular shape in cross-section.

11. The laminated LC component according to claim 1, wherein the coil has a substantially elliptic shape in cross-section.

12. The laminated LC component according to claim 1, wherein the coil has a substantially rectangular shape in cross-section.

13. The laminated LC component according to claim 1, wherein said capacitor comprises two pairs of said capacitor electrodes, each of said two pairs of said capacitor electrodes being connected through a via hole, and the via hole is located at the center of the respective one of said two pairs of said capacitor electrodes.

14. A laminated LC component comprising:
a laminated block including a plurality of insulating layers, a plurality of coil conductors, and a plurality of capacitor electrodes stacked on each other in a stacking direction, the laminated block including a mounting surface;
said plurality of coil conductors being electrically connected so as to define a coil, said coil having an axis that is substantially parallel to the stacking direction of said laminated block and also substantially parallel to the mounting surface of said laminated block;
said plurality of capacitor electrodes being arranged and electrically connected to define a capacitor, said capacitor being electrically connected to said coil;
an external input/output electrode disposed on an end of said laminated block; and
an external ground electrode having a substantially band shape and extending along a circumference over four side surfaces of said laminated block;
wherein the ends of the capacitor electrodes at a ground side of the capacitor are exposed at the four respective side surfaces of said laminated block and said ends of the capacitor electrodes are electrically connected, at said four side surfaces, to the external ground electrode, and wherein any of said four side surfaces is arranged to be used as a mounting surface; and
at least one of the capacitor electrodes has a substantially cross shaped configuration.

15. The laminated LC component according to claim 14, wherein ends of each of the substantially cross-shaped capacitor electrodes are exposed at the four respective sides of the laminated block.

16. A laminated LC component comprising:
a laminated block including a plurality of insulating layers, a plurality of coil conductors, and a plurality of capacitor electrodes stacked on each other in a stacking direction, the laminated block including a mounting surface;
said plurality of coil conductors being electrically connected so as to define a coil, said plurality of capacitor electrodes being arranged and electrically connected to define a capacitor, said capacitor being electrically connected to said coil;
an external input/output electrode disposed on an end of said laminated block; and
an external ground electrode disposed on said laminated block;
wherein the ends of the capacitor electrodes at a ground side of the capacitor are exposed at the four respective side surfaces of said laminated block and said ends of the capacitor electrodes are electrically connected, at said four side surfaces, to the external ground electrode, and wherein any of said four side surfaces is arranged to be used as a mounting surface, and said capacitor electrodes having a rotationally symmetric configuration about the center of each of said capacitor electrodes.

17. The laminated LC component according to claim 16, wherein external ground electrode has a substantially band shape and extends along a circumference over four side surfaces of said laminated block.

18. The laminated LC component according to claim 16, wherein via holes are formed in the plurality of insulating layers and clearance areas where no electrode material of the capacitor electrodes is located are defined between the via holes and the capacitor electrodes.

19. The laminated LC component according to claim 16, wherein one of the capacitor electrodes is a capacitor ground electrode, the LC component is mounted on a circuit board and a length of a conductor path from a ground pattern on the circuit board to the capacitor ground electrode via the external ground electrode is substantially equal if any of the four side surfaces is used as the mounting surface.

20. The laminated LC component according to claim 16, wherein said capacitor comprises two pairs of said capacitor electrodes, each of said two pairs of said capacitor electrodes being connected through a via hole, and the via hole is located at the center of the respective one of said two pairs of said capacitor electrodes.

21. A laminated LC component comprising:
a laminated block having a substantially square shape in lateral cross section including a plurality of insulating layers, a plurality of coil conductors, and a plurality of capacitor electrodes stacked on each other in a stacking direction, the laminated block including a mounting surface;

said plurality of coil conductors being electrically connected so as to define a coil, said coil having an axis that is substantially parallel to the stacking direction of said laminated block and also substantially parallel to the mounting surface of said laminated block;

said plurality of capacitor electrodes being arranged and electrically connected to define a capacitor, said capacitor being electrically connected to said coil;

an external input/output electrode disposed on an end of said laminated block; and an external ground electrode having a substantially band shape and extending along a circumference over four side surfaces of said laminated block;

wherein the ends of the capacitor electrodes at a ground side of the capacitor are exposed at the four respective side surfaces of said laminated block and said ends of the capacitor electrodes are electrically connected, at said four side surfaces, to the external ground electrode, and wherein any of said four side surfaces is arranged to be used as a mounting surface.

22. A laminated LC component comprising:

a laminated block including a plurality of insulating layers, a plurality of coil conductors, and a plurality of capacitor electrodes stacked on each other in a stacking direction, the laminated block including a mounting surface;

said plurality of coil conductors being electrically connected so as to define a coil, said plurality of capacitor electrodes being arranged and electrically connected to define a capacitor, said capacitor being electrically connected to said coil;

an external input/output electrode disposed on an end of said laminated block; and an external ground electrode disposed on said laminated block;

wherein the ends of the capacitor electrodes at a ground side of the capacitor are exposed at the four respective side surfaces of said laminated block and said ends of the capacitor electrodes are electrically connected, at said four side surfaces, to the external ground electrode, and wherein any of said four side surfaces is arranged to be used as a mounting surface;

at least one of the capacitor electrodes has a substantially cross shaped configuration.

23. The laminated LC component according to claim 22, wherein ends of each of the substantially cross-shaped capacitor electrodes are exposed at the four respective sides of the laminated block.

* * * * *